United States Patent [19]
Masamoto

[11] Patent Number: 5,144,547
[45] Date of Patent: Sep. 1, 1992

[54] RECTIFYING CIRCUIT WITH FETS

[75] Inventor: Kazuhiko Masamoto, Tokyo, Japan

[73] Assignee: NEC Corporation, Tokyo, Japan

[21] Appl. No.: 711,631

[22] Filed: Jun. 6, 1991

[30] Foreign Application Priority Data

Jun. 8, 1990 [JP] Japan .................... 2-148619

[51] Int. Cl.$^5$ .......................................... H02M 3/335
[52] U.S. Cl. ...................... 363/127; 363/20; 323/289
[58] Field of Search ............. 363/20, 21, 89, 97, 363/127; 323/289

[56] References Cited

U.S. PATENT DOCUMENTS 4,903,182  2/1990  Pilukaitis et al. ............ 323/289
4,970,635  11/1990  Shekhawat et al. ........... 323/289

FOREIGN PATENT DOCUMENTS 0206944  12/1982  Japan ....................... 323/289

OTHER PUBLICATIONS

C. J. Palmucci, "Switching Regulator with Transistor Turnoff", IBM Technical Disclosure Bulletin, vol. 16, No. 4, Sep. 1973, p. 1161.

Primary Examiner—Peter S. Wong
Attorney, Agent, or Firm—Laff, Whitesel, Conte & Saret

[57] ABSTRACT

A rectifying circuit having rectifying elements in the form of FETs (Field Effect Transistors) and applicable to a switching regulator or similar device. The rectifying circuit has a gate discharging circuit which half-wave rectifies the drive voltages for the FETs and discharges charges stored in the gate capacitance of each FET. The circuit reduces the drive losses of the FETs to a considerable degree.

4 Claims, 5 Drawing Sheets

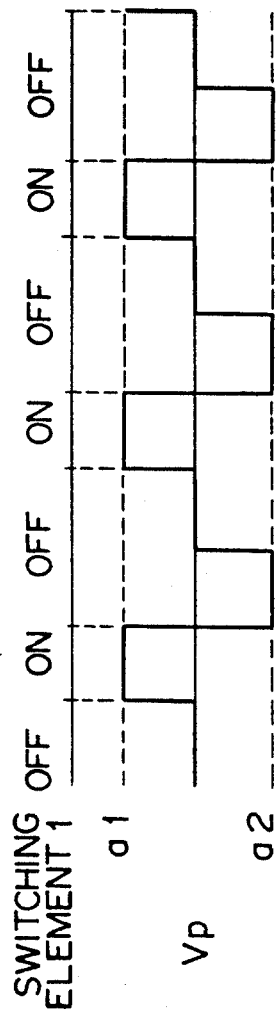
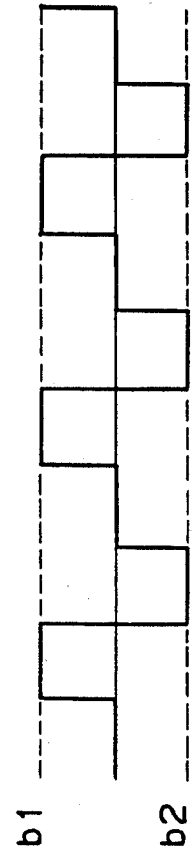
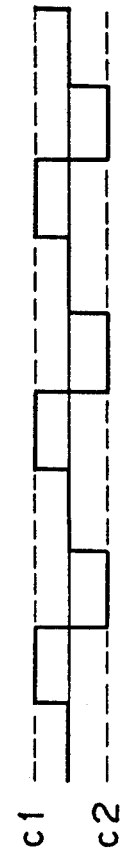
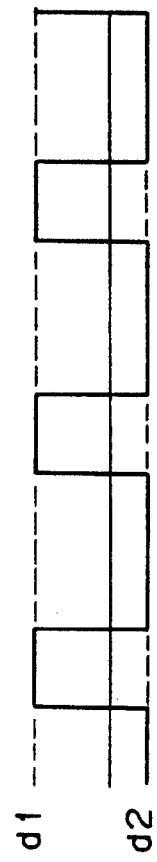
Fig.3A  Vp
Fig.3B  Vs1
Fig.3C  Vs2
Fig.3D  Vℓ1

RECTIFYING CIRCUIT WITH FETS

BACKGROUND OF THE INVENTION

The present invention relates to a rectifying circuit of the type using FETs (Field Effect Transistors) as rectifying elements and, more particularly, to a rectifying circuit applicable to, for example, a switching regulator which is a switching type DC stabilizing power source device.

A switching regulator is extensively used today as a power source device for stabilizing a predetermined DC voltage and DC current to be applied to an electric or electronic equipment, i.e., a load. The switching regulator includes a rectifying circuit in which rectifying elements in the form of diodes or FETs are incorporated. The problem with the rectifying circuit with diodes which are non-linear elements is that the efficiency is noticeably lowered due to losses ascribable to the forward voltage drop of the diodes. This is especially true when use is made of a power source whose output voltage is low. By contrast, the rectifying circuit using FETs, or linear elements maintains the voltage drop ascribable to an output current smaller than the forward voltage drop of diodes if the FETs each has a sufficiently low ON state resistance, thereby insuring satisfactory efficiency.

However, the conventional rectifying circuit using FETs as rectifying elements has the following problems. The output of a transformer and that of a choke coil or inductor are directly applied to between the gates and the sources of the FETs, respectively. Hence, the capacitances between the gates and the sources of the FETs each is charged in positive polarity during the ON time and discharged in negative polarity during the OFF time alternately, resulting in considerable drive losses of the FETs. Furthermore, since such drive losses increase in proportion to the switching frequency of a switching element which converts a DC voltage to an AC voltage and applies it to the transformer, the efficiency is lowered in relation to the design of a switching regulator of higher frequency.

SUMMARY OF THE INVENTION

It is therefore an object of the present invention to provide a rectifying circuit with FETs which reduces the drive losses of FETs to a considerable degree.

It is another object of the present invention to provide a generally improved rectifying circuit with FETs.

A rectifying circuit for rectifying an AC voltage fed from an AC power source of the present invention comprises a first and a second FET serving as rectifying elements. The first and second FETs have their drains commonly connected at a junction. A current from the AC power source is applied to between the sources of the first and second FETs to cause a rectified output voltage to appear on the junction. A gate discharging circuit for half-wave rectifying drive voltages for the first and second FETs and discharges charges stored in the gate capacitances of the first and second FETs.

BRIEF DESCRIPTION OF THE DRAWINGS

The above and other objects, features and advantages of the present invention will become more apparent from the following detailed description taken with the accompanying drawings in which:

FIGS. 3A-3H plot the waveforms of voltages appearing in various sections of the circuits shown in FIGS. 1 and 4.

DESCRIPTION OF THE PREFERRED EMBODIMENT

Figure 1:
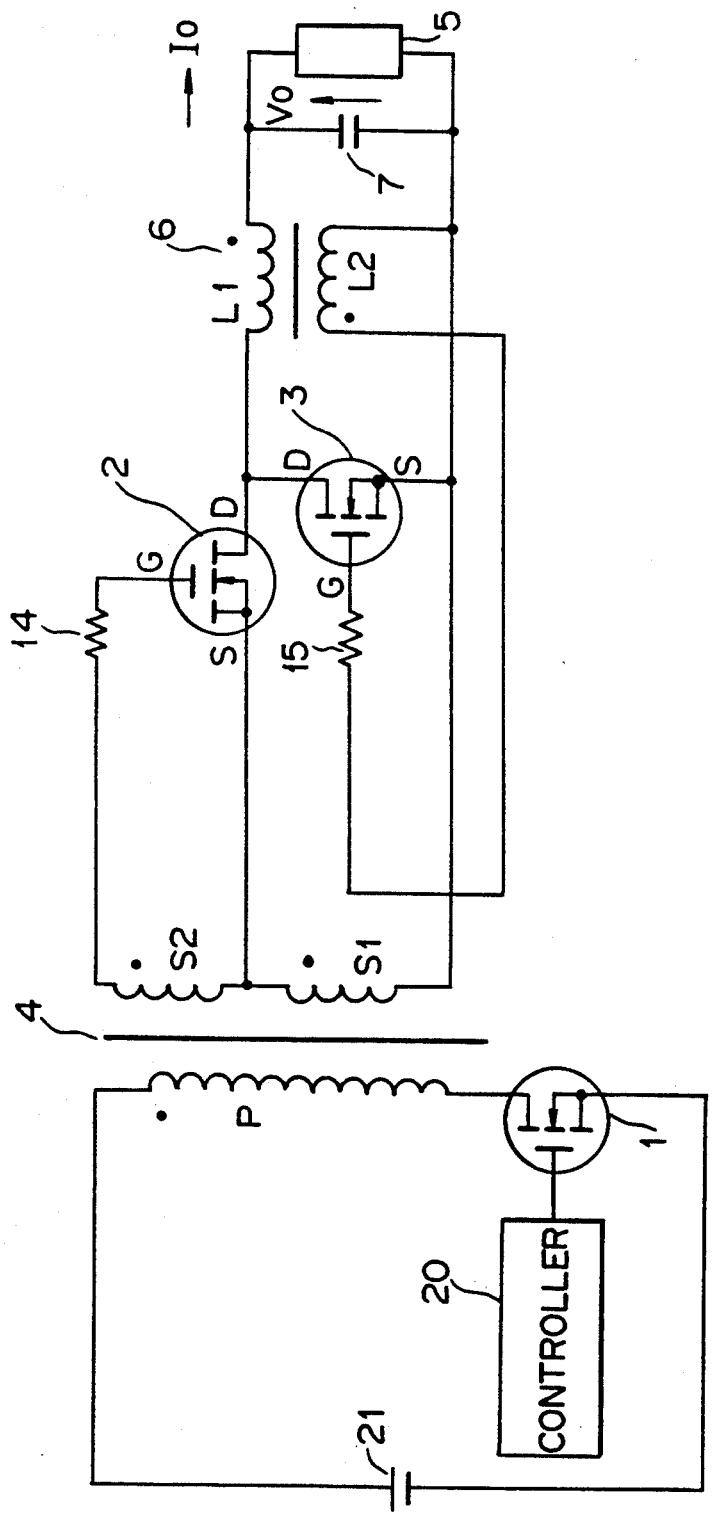
FIG. 1 is a diagram showing a conventional rectifying circuit implemented with FETs.

To better understand the present invention, a reference will be made to a conventional rectifying circuit using FETs, shown in FIG. 1. As shown, the rectifying circuit has a switching element 1, FETs 2 and 3, a transformer 4, an inductor implemented as a choke coil 6, a capacitor 7, resistors 14 and 15, a controller 20, and a DC power source 21. The reference numeral 5 designates a load connected to the rectifying circuit. The rectifying circuit outputs a voltage $V_o$ and a current $I_o$.

The transformer 4 is made up of a primary or input winding P, a secondary or output winding S1, and a secondary or drive winding S2. The switching element 1 converts the DC voltage of the DC power source 21 to an AC voltage under the control of the controller 20 and delivers it to the input winding P of the transformer 4. The output winding S1 feeds energy to a smoothing circuit constituted by the choke coil 6 and capacitor 7, via the FET 2. The drive winding S2 is connected to between the gate and the source of the FET 2 via the resistor 14. The choke coil 6 has a primary winding L1 and a secondary or drive winding L2. The FETs 2 and 3 have their drains commonly connected, sources connected to opposite ends of the output winding S1, and gates connected to the drive winding S2 and the drive winding L2 of the choke coil 6 via the resistors 14 and 15. The primary winding L1 of the choke coil 6 is connected to between the commonly connected drains of the FETs 2 and 3 and the load 5, while the drive winding L2 is connected to between the gate and the source of the FET 3 via the resistor 15. The capacitor 7 is connected to opposite ends of the load 5. In this configuration, an AC current is applied from the secondary side of the transformer 4 to between the sources of the FETs, or rectifying elements, 2 and 3. As a result, a rectified output appears on the junction of the commonly connected drains of the FETs 2 and 3.

Figure 2:
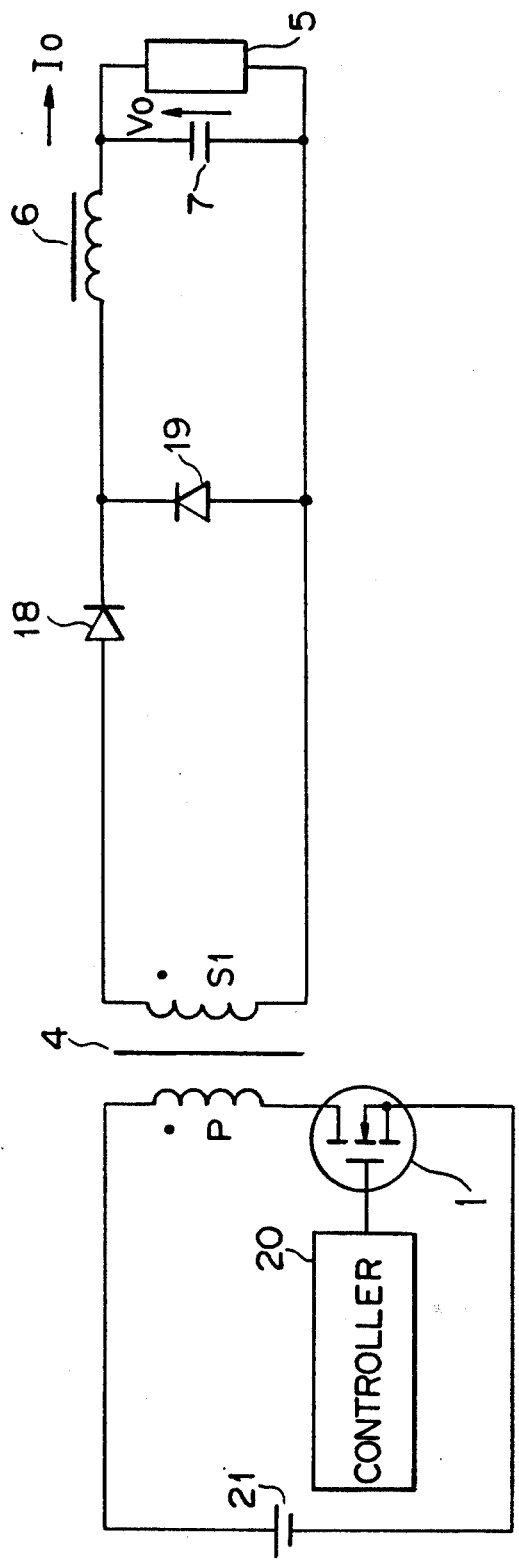
FIG. 2 is a diagram showing another conventional rectifying circuit which is implemented with diodes.

FIG. 2 shows another conventional rectifying circuit which uses diodes 18 and 19 as rectifying elements. In FIG. 2, components or elements equivalent in function to those shown in FIG. 1 are designated by the same reference numerals, and redundant description will be avoided for simplicity.

Figure 3E:
Figure 3F:
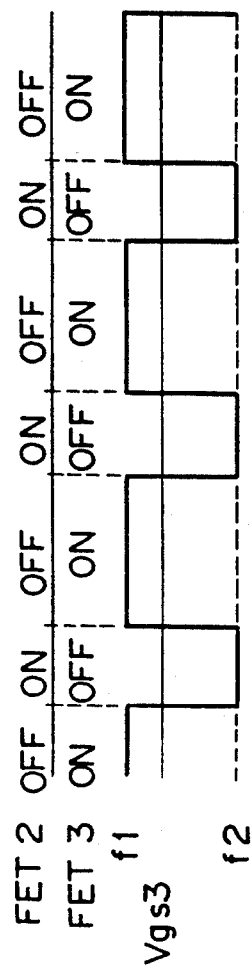
Figure 3G:
Figure 3H:
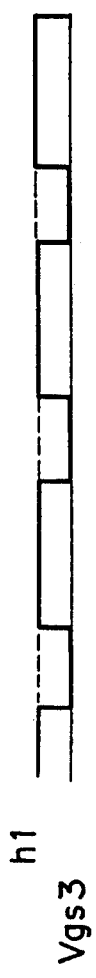

FIGS. 3A through 3H plot the waveforms of voltages appearing in various sections of the prior art circuitry described above with reference to FIG. 1. Specifically, FIG. 3A shows an AC voltage $V_p$ applied to the transformer 4 and having levels $a_1$ and $a_2$ which are representative of $V_{in}$ and $-V_{in}$, respectively. FIGS. 3B and 3C show respectively the output voltages $V_{s1}$ and $V_{s2}$ of the transformer 4; levels $b_1$, $b_2$, $c_1$ and $c_2$ are representative of $S1 \cdot V_{in}/P$, $-S1 \cdot V_{in}/P$, $S2 \cdot V_{in}/P$, and $-S2 \cdot V_{in}/P$, respectively. FIG. 3D shows a voltage $V_{l1}$ applied to the primary winding L1 of the choke coil or inductor 6 and having levels $d_1$ and $d_2$ representative of $S1 \cdot V_{in}/P - V_{in} - V_o - I_o \cdot R_{on2}$ and $-V_o - I_o \cdot R_{on3}$, respectively. FIG. 3E shows the gate voltage $V_{gs2}$ of the FET 2 which has levels $e_1$ and $e_2$ representative of $S2 \cdot V_{in}/P$ and $-S2 \cdot V_{in}/P$, respectively. FIG. 3F shows the gate voltage $V_{gs3}$ of the FET 3 which has levels $f_1$ and $f_2$ representative of $L2(V_o+I_oR_{on3})/L1$ and $L2(S1 \cdot V_{in}/P - V_o - I_oR_{on2})/L1$, respectively. FIG. 3G shows another gate voltage $V_{gs2}$ of the FET 2 whose level $g_1$ is representative of $S2 \cdot V_{in}/P - 2V_1$. Further, FIG. 3H shows another gate voltage $V_{gs3}$ of the FET 3 which has a level $h_1$ representative of $L2(V_o+I_oR_{on3})/L1 - 2V_1$. Here, $R_{on2}$ and $R_{on3}$ indicate respectively the ON resistances of the FETs 2 and 3, $I_oR_{on1}$ and $I_oR_{on2}$ indicate voltage drops due to the output current, and $V_1$ indicate the forward drop voltage of the diodes which will be described.

The operation of the circuitry shown in FIG. 1 will be described with reference to FIGS. 3A through 3H. The switching element 1 converts the DC voltage of the DC power source 21 to the AC voltage $V_p$ in response to a control signal fed thereto from the controller 20. The AC voltage $V_p$ is applied to the primary winding P of the transformer 4 (see FIG. 3A). In response, the transformer 4 produces the output voltages $V_{s1}$ and $V_{s2}$ on the output winding S1 and drive winding S2 which are the secondary windings (see FIGS. 3B and 3C). These voltages $V_{s1}$ and $V_{s2}$ are proportionate to the turn ratio of the transformer 4. The voltage $V_{s2}$ is fed to between the gate and the source of the FET 2 via the current limiting resistor 14 as the gate voltage $V_{gs2}$. The gate voltage $V_{gs2}$ is so selected as to exceed the gate threshold voltage of the FET2 on the basis of the turn ratio of the transformer 4. This, coupled with the fact that all the windings P, S1 and S2 of the transformer 4 are identical in polarity, allows the switching element 1 and FET2 to operate synchronously with each other (see FIG. 3E). As a result, the voltage $V_{s1}$ appearing on the output winding S1 during the ON time of the switching element 1 is dropped by the low ON state resistance $R_{on2}$ of the FET 2 and then smoothed by the smoothing circuit made up of the choke coil or inductor 6 and capacitor 7. At this instant, the voltage $V_{l1}$ is applied to the primary winding L1 of the choke coil 6 (see FIG. 3D). The drive winding L2 of the choke coil 6 is connected to between the gate and the source of the FET 3 via the resistor 15 in opposite relation in polarity to the primary winding L1. The FET 3, therefore, remains in an OFF state when the switching element 1 and FET 2 are in an ON state (see FIG. 3F). Subsequently, when the switching element 1 is turned off in response to the control signal from the controller 20, the output voltages $V_{s1}$ and $V_{s2}$ of the transformer 4 are inverted to in turn render the FET 2 non-conductive. Then, the application of voltage to the primary winding L1 of the choke coil 6 is interrupted, causing the magnetic energy having been accumulated during the ON time to be discharged. As a result, the voltage on the primary winding L1 of the choke coil 6 is inverted. The FET 3, therefore, remains in an ON state when the switching element 1 is in an OFF state. In this condition, the voltage due to the energy released from the choke coil 6 is dropped by the low ON state resistance $R_{on3}$ of the FET 3 and then applied to the load 5.

The operation described above is also true with the rectifying circuit of the type using diodes as shown in FIG. 2. The problem with the circuitry of FIG. 2 is that since the diodes are non-linear elements, the efficiency is noticeably lowered by the loss ascribable to the forward voltage drop. This problem is especially pronounced when use is made of a power source whose output voltage is low. By contrast, the circuitry of FIG. 2 allows a minimum of reduction in efficiency to occur by selecting FETs, or linear elements, whose ON state resistance is low, i.e., by maintaining the voltage drop $I_oR_{on}$ due to the output current smaller than the forward voltage drop $V_f$ of diodes.

However, the conventional rectifying circuit using FETs as rectifying elements has problems left unsolved, as follows. As shown in FIG. 1, the outputs of the transformer 4 and choke coil or inductor 6 are directly applied to between the gates and the sources of the FETS 2 and 3, respectively. Hence, the capacitances between the gates and the sources of the FETs 2 and 3 each is charged in positive polarity during the ON time and discharged in negative polarity during the OFF time alternately, resulting in considerable drive losses of the FETs 2 and 3. Furthermore, since such drive losses increase in proportion to the switching frequency of the switching element 1, the efficiency is lowered in relation to the design of a switching regulator of higher frequency.

Figure 4:
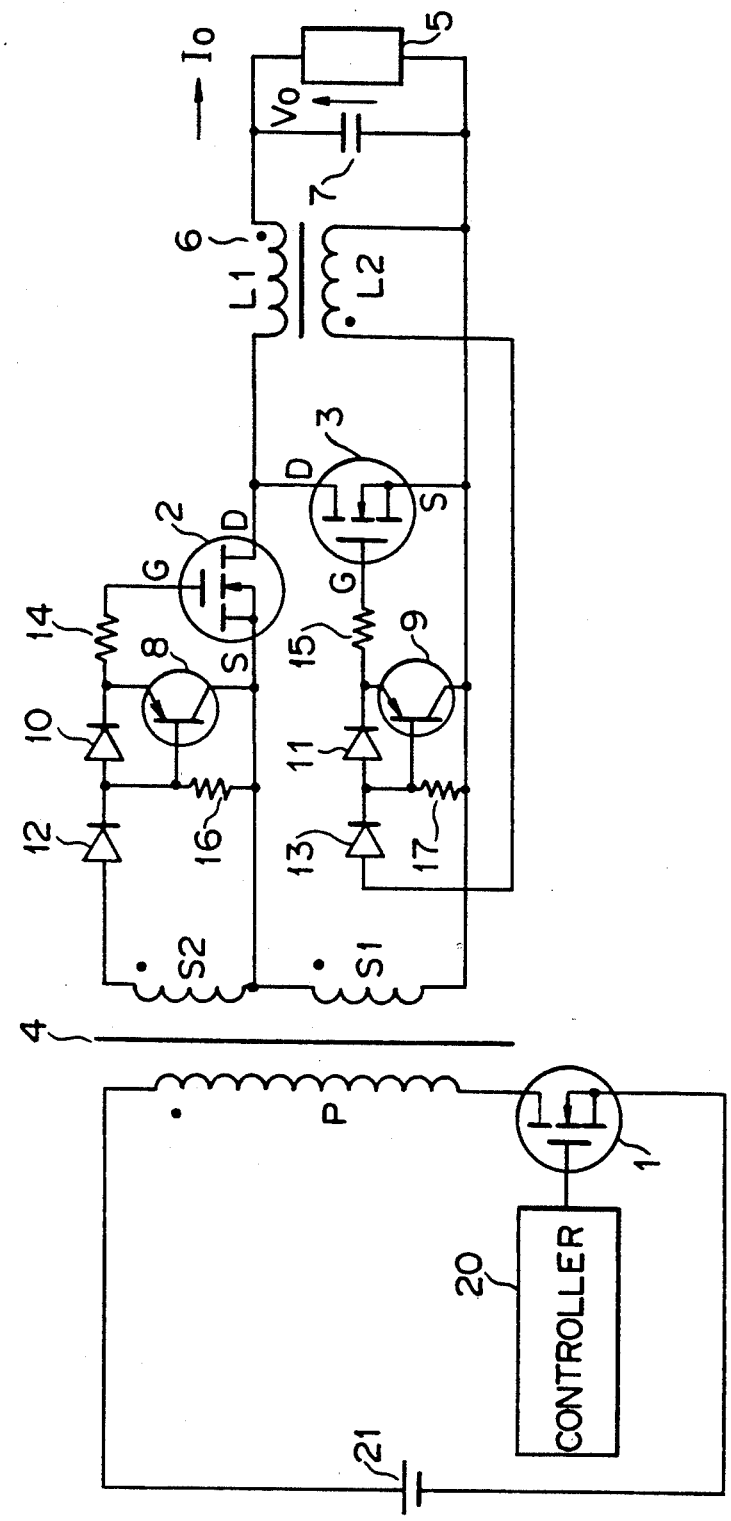
FIG. 4 is a diagram showing a rectifying circuit with FETs embodying the present invention.

Referring to FIG. 4, a rectifying circuit embodying the present invention is shown. In FIG. 4, components or elements equivalent in function to those shown in FIG. 1 are designated by like reference numerals, and redundant description will be avoided for simplicity. As shown, the rectifying circuit has FETs 2 and 3. P—n—p transistors 8 and 9 have emitters respectively connected to between the gates and the sources of the FETs 2 and 3 and collectors respectively connected to the sources of the FETs 2 and 3. Diodes 10 and 11 have cathodes respectively connected to the emitters of the transistors 8 and 9 and anodes respectively connected to the bases of the transistors 8 and 9. Diodes 12 and 13 have cathodes connected to the anodes of the diodes 10 and 11, respectively. A transformer 4 has a winding S2 connected to the anode of the diode 12 associated with the FET 2. A choke coil or inductance 6 has a winding L2 connected to the anode of the diode 13 associated with the FET 3. The diodes 12 and 13 half-wave rectify the drive voltages for the FETs 2 and 3, respectively. The p—n—p transistors 8 and 9 each discharges the charge accumulated in the gate capacitance. The p—n—p transistors 8 and 9, diodes 10 and 11 and resistors 16 and 17 constitute a gate discharging circuit in cooperation.

In operation, a switching element 1 converts the DC voltage of a power source 21 in response to a control signal from a controller 20 and applies it to the transformer 4. When the switching element 1 is turned on, the output voltage $V_{s2}$ of the transformer 4 appearing on the drive winding S2 is half-wave rectified by the diode 12. The resultant output of the diode 12 is applied to between the gate and the source of the FET 2 via the diode 10 and resistor 14, thereby rendering the FET 2 conductive. When the switching element 1 is turned off, the diode 12 prevents the capacitance between the gate and the source of the FET 2 from being charged in negative polarity despite that the output voltage $V_{s2}$ of on the drive winding S2 is inverted to negative polarity. Further, since the base voltage of the transistor 8 is biased to zero via the resistor 16, the charge having been stored in the gate capacitance $C_{gs}$ of the FET 2 causes the base current of the FET 8 to flow from the resistor 14 to the resistor 16 via the emitter and base of the transistor 8. As a result, the transistor 8 short-circuits the gate and source of the FET 2 immediately and thereby turns off the FET 2. The transistor 14 serves to limit the current surge of the transistor 8 when the diodes 12 and 10 are charged and when the transistor 8 is discharged.

On the other hand, when the switching element 1 is turned on, the voltage applied to the primary winding L1 of the choke coil or inductor 6 is outputted to the drive winding L2 in the opposite polarity. However, the inductance between the gate and the source of the FET3 is not charged in negative polarity due to the diode 13. Nevertheless, the charge having been stored in the gate capacitance of the FET 3 while the switching element 1 has been turned off causes a base current to flow from the resistor 15 to the resistor 17 by way of the emitter and base of the transistor 9. As a result, the transistor 9 short-circuits the gate and source of the FET 3 immediately and thereby turns off the FET 3. Subsequently, when the switching element 1 is turned off, a voltage is inducted in the drive winding L2 of the choke coil 6 to turn on the FET 3 via the diodes 13 and 11 and resistor 15.

Although the sequence of operations described above is basically identical with the sequence of the conventional circuit shown in FIG. 1, the illustrative embodiment reduces the drive losses of the FETs 2 and 3 since the gate capacitance is charged and discharged only in positive polarity. Specifically, assuming that the drive losses of the FETs 2 and 3 of the circuit shown in FIG. 1 are $P_{g2}$ and $P_{g3}$, respectively, they are expressed as:

$$P_{g2} = 2C_{g2}(S2 \cdot V_{in}/P)^2 f \quad \text{Eq. (1)}$$

$$P_{g3} = C_{g3}(L2/L1)^2[(V_o + I_o R_{on3})^2 + (S1 \cdot V_{in}/P - V_o - I_o R_{on2})^2]f \quad \text{Eq. (2)}$$

where $C_{g2}$ and $C_{g3}$ are respectively the gate-source capacitances of the FETs 2 and 3 taking account of the Miller effect, and $R_{on2}$ and $R_{on3}$ are respectively the ON state resistances of the FETs 2 and 3, and f is the switching frequency of the switching element 1.

By contrast, assuming that the drive losses of the FETs 2 and 3 particular to the illustrative embodiment, FIG. 4, are $P'_{g2}$ and $P'_{g3}$, respectively, they are produced by:

$$P'_{g2} = C_{g2}(S2 \cdot V_{in}/P - 2V_f)^2 f \quad \text{Eq. (3)}$$

$$P'_{g3} = C_{g3}[L2(V_o + I_o R_{on3})/L1 - 2V_f]^2 \quad \text{Eq. (4)}$$

where $V_f$ is the forward drop voltage of the diodes 12, 10, 13 and 11.

As the Eqs. (3) an (4) indicate, the embodiment constitutes a noticeable improvement over the prior art regarding the drive losses of FETs.

In summary, it will be seen that the present invention provides a rectifying circuit having a gate discharging circuit which half-wave rectifies the drive voltages for FETs and discharges the charges stored in the gate capacitances of the FETs. This is successful in reducing the drive losses of FETs to a considerable degree.

Various modifications will become possible for those skilled in the art after receiving the teachings of the present disclosure without departing from the scope thereof.

What is claimed is:

1. A rectifying circuit for rectifying an AC voltage fed from an AC power source, comprising:
    a first and a second FET (Field Effect Transistors) serving as rectifying elements, said first and second FETs having drains thereof commonly connected at a junction, a current from said AC power source being applied to between sources of said first and second FETs to cause a rectified output voltage to appear on said junction; and
    gate discharging means for half-wave rectifying drive voltages for said first and second FETs and discharging charges stored in gate capacitances of said first and second FETs.

2. A circuit as claimed in claim 1, wherein said gate discharging means comprises:
    a first and a second transistor having emitters thereof respectively connected to gates of said first and second FETs and collectors thereof respectively connected to said sources of said first and second FETs;
    a first and a second diode having cathodes thereof respectively connected to emitters of said first and second transistors and anodes thereof respectively connected to bases of said first and second transistors; and
    a third and a fourth diode having cathodes thereof respectively connected to anodes of said first and second diodes.

3. A circuit as claimed in claim 2, wherein said AC power source comprises a primary winding P to which said AC voltage is applied, a first secondary winding connected at opposite ends thereof to said cathode of said third diode and said collector of said first transistor, and a second secondary winding connected at opposite ends thereof to said collectors of said first and second transistors.

4. A circuit as claimed in claim 3, further comprising an inductor comprising a first winding connected at one end thereof to said junction of said drains of said first and second FETs, and a secondary winding connected at opposite ends thereof to an anode of said fourth diode and said source of said second FET.

* * * * *